(12) United States Patent
Roesner et al.

(10) Patent No.: US 8,848,360 B2
(45) Date of Patent: Sep. 30, 2014

(54) MODULE AND PORT

(75) Inventors: Arlen L. Roesner, Ft. Collins, CO (US); Paul Kessier Rosenberg, Sunnyvale, CA (US); Michael Renne Ty Tan, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 146 days.

(21) Appl. No.: 13/702,202

(22) PCT Filed: Jun. 7, 2010

(86) PCT No.: PCT/US2010/037654
§ 371 (c)(1),
(2), (4) Date: Dec. 5, 2012

(87) PCT Pub. No.: WO2011/155924
PCT Pub. Date: Dec. 15, 2011

(65) Prior Publication Data
US 2013/0088822 A1    Apr. 11, 2013

(51) Int. Cl.
*G06F 1/16* (2006.01)
*G06F 1/18* (2006.01)
*H01R 13/631* (2006.01)
*H05K 13/00* (2006.01)
*G11B 33/12* (2006.01)

(52) U.S. Cl.
CPC ...... *G06F 1/1601* (2013.01); *G06F 2200/1635* (2013.01); *G06F 1/181* (2013.01); *H01R 13/6315* (2013.01); *H05K 13/0023* (2013.01); *G11B 33/122* (2013.01); *G06F 1/183* (2013.01); *G06F 1/187* (2013.01)

USPC .................................. 361/679.4; 361/679.32

(58) Field of Classification Search
CPC ................................ G06F 1/183; G06F 1/187
USPC ...................................................... 361/679.4
See application file for complete search history.

(56) References Cited

U.S. PATENT DOCUMENTS

| 5,999,952 | A  | * | 12/1999 | Jenkins et al. ............... 708/100 |
| 6,206,578 | B1 |   | 3/2001  | Shin et al. |
| 6,252,514 | B1 | * | 6/2001  | Nolan et al. ............... 340/686.4 |
| 6,799,897 | B2 |   | 10/2004 | Sherrer |
| 7,217,040 | B2 |   | 5/2007  | Crews et al. |
| 7,499,272 | B2 | * | 3/2009  | Searby et al. ............ 361/679.22 |
| 2005/0117309 | A1 |   | 6/2005 | Rieken et al. |
| 2005/0168937 | A1 |   | 8/2005 | Yin et al. |
| 2005/0190534 | A1 | * | 9/2005 | Blackwell .................... 361/683 |
| 2006/0050487 | A1 |   | 3/2006 | Wu et al. |
| 2009/0244855 | A1 |   | 10/2009 | Rosenberg et al. |
| 2010/0027941 | A1 |   | 2/2010 | Stewart et al. |

FOREIGN PATENT DOCUMENTS

WO    WO-2009/136899 A1    11/2009

OTHER PUBLICATIONS

International Search Report and Written Opinion received in PCT Application No. PCT/US2010/037654, mailed Feb. 24, 2011, 9 pages.

* cited by examiner

*Primary Examiner* — Anthony Q Edwards
(74) *Attorney, Agent, or Firm* — Reed Hablinski

(57) ABSTRACT

A module includes a housing. The housing can include a port. The port can extend though an opening in the housing if the module is inserted in the chassis.

15 Claims, 7 Drawing Sheets

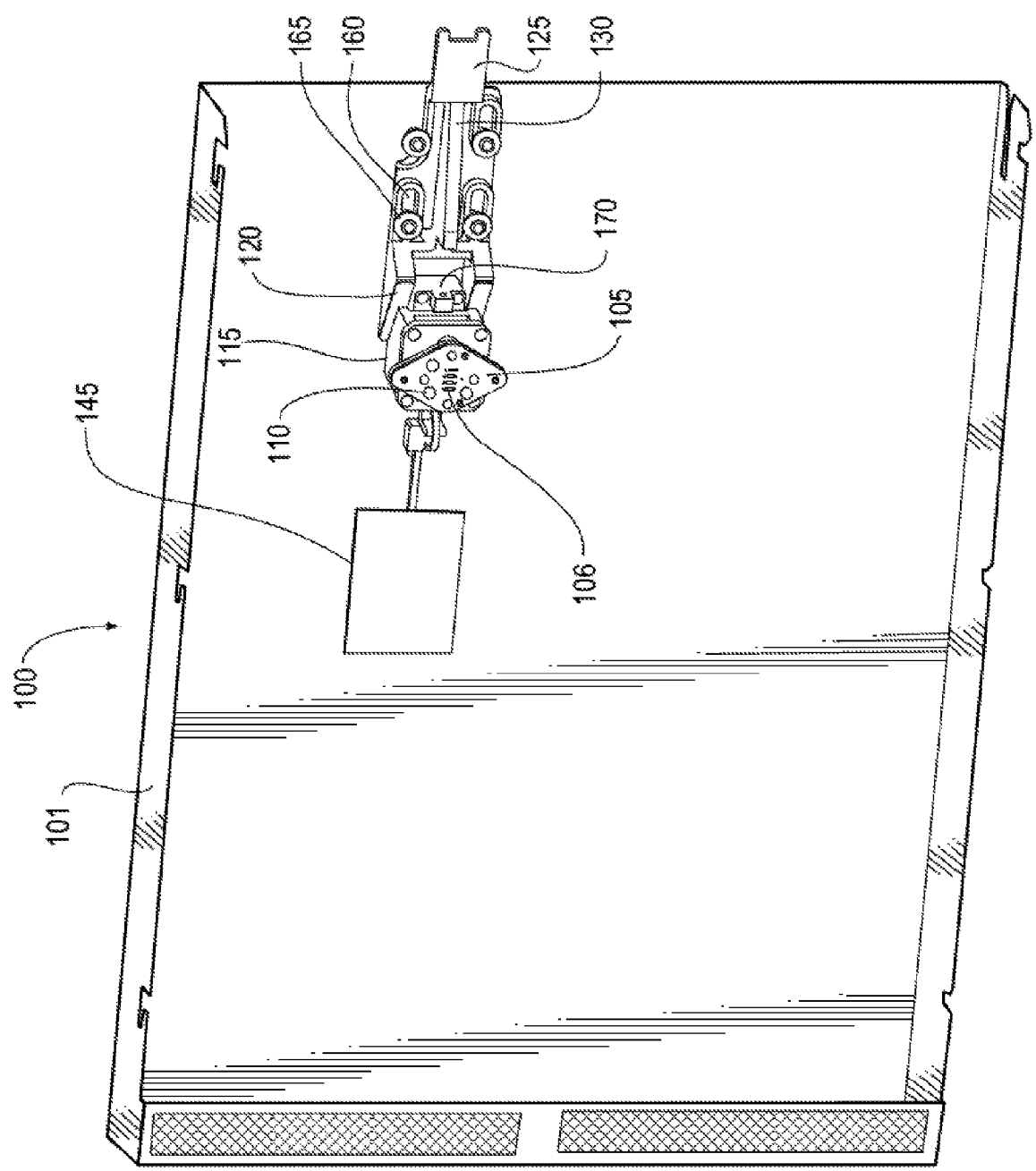

MODULE AND PORT

BACKGROUND

A computing system may be a modular system. The system may include a processing module and a storage module for example. The modules can be installed in a chassis that the modules connect to. The chassis provides a communications channel between the modules and can also provide the modules with power. The communications between the modules is an electrical connection that carries electrical signals between the modules. The electrical connection can be communications bus. The components may be able to process information faster than the communications bus can carry the information creating a bottleneck between the modules as they are waiting to send or receive information on the communications bus.

BRIEF DESCRIPTION OF THE DRAWINGS

Some embodiments of the invention are described with respect to the following figures:

FIG. 1 is a module according to an example embodiment of the invention;

DETAILED DESCRIPTION

Figure 2A:
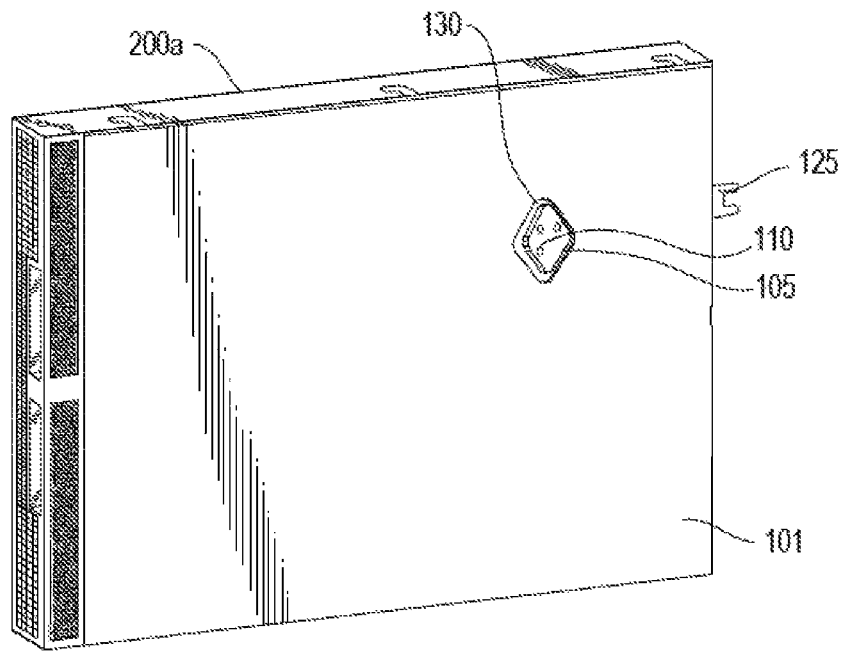
FIG. 2a is a first module according to an example embodiment of the invention.

To reduce the communications bottleneck between the modules of a system the module can communicate directly with each other and not through the chassis that they are installed in. Modules communicating directly with each other may be able to reduce the bate neck created by the chassis which may transmit information for more than the two modules that are trying to communicate on the communications bus.

Optical communications can transmit data at the speed of light and may include multiple channels of data in the form of modulation of the light. An electrical based communications bus may also include multiple channels of data by for example a modulation of the channels.

The modular computing system wherein the modules can communicate directly with each other and not rely on the chassis for communications between the modules while also implementing an optical communications system can reduce the bottleneck created by a communications system in the chassis connecting the two modules or by an electrical based communications system.

In one embodiment, a module includes a housing. The housing can include a port. The port can extend though an opening in the housing if the module is inserted in the chassis.

With reference to the figures, FIG. 1 is a module according to an example embodiment of the invention. The system includes a first module 100. The first module 100 and includes a first housing 101. The first housing 101 can include a component 145 of the computing system. For example if a first module 100 is a processing module the components may include a processor or if the first module 100 is a storage module the components may include a storage device such as a hard drive, an optical drive, or another form of storage.

The component 145 may communicate with a first bus 106. The first bus 106 may be an optical bus or an electrical bus. If the first bus is an optical bus an optical sender and an optical receiver may be attached to a first port 105. The first port 105 may include a first alignment device 110. The first alignment device 110 can help align the optical sender and the optical receiver for the optical bus to communicate with an optical bus on another module. In one embodiment the alignment device 110 is a magnetic material. The magnetic material may be a magnet that attracts an magnetic material or may be a material attracted by a magnet for example iron or steel.

The first port 105 can be attached to a base 115 that is attached to a mount 170. The mount 170 can be attached to the first housing 101. The base 115 may be attached to the mount 170 by a spring, piston or another guide mechanism. The spring, the piston, or the other guide mechanism can apply force pulling the base toward the mount 170. A first device 120 can move between the base and the first housing 101 or the mount 170. The first device may be for example a ramp shape that exerts more force on the base 115 as the first device 120 is moved under the base 115. The first device 120 can apply a force to overcome the force applied by the spring or the piston pulling the base 115 toward the mount 170.

The first device 120 can be attached to the first housing 101 by a fastener 165. The first device 120 may include an aperture 160. The fastener 165 can pass through the aperture 160 to attach the first device 120 to the first housing 101. The aperture 160 can be elongated and the first device 120 can move in the direction of the elongation of the aperture 160. The first device 120 can be attached to an arm 130. In one embodiment the aperture 160 is in the arm 130 and the first device 120 is attached to the arm 130. The arm 130 may include a plunger 125 that extends through the first housing 101. The arm 130, the plunger 125, and the first device 120 can be a single piece or maybe multiple pieces attached together.

In one embodiment when the plunger 125 is forced into the first housing 101 the arm 130 moves the first device 120. The first device 120 applies a force to the base 115 causing the base 115 to move away from the mount 170. Since the first port 105 is at ached to the base 115 the first port 105 also moves away from the mount 170 if the plunger 125 is forced into the housing 101.

Figure 2B:
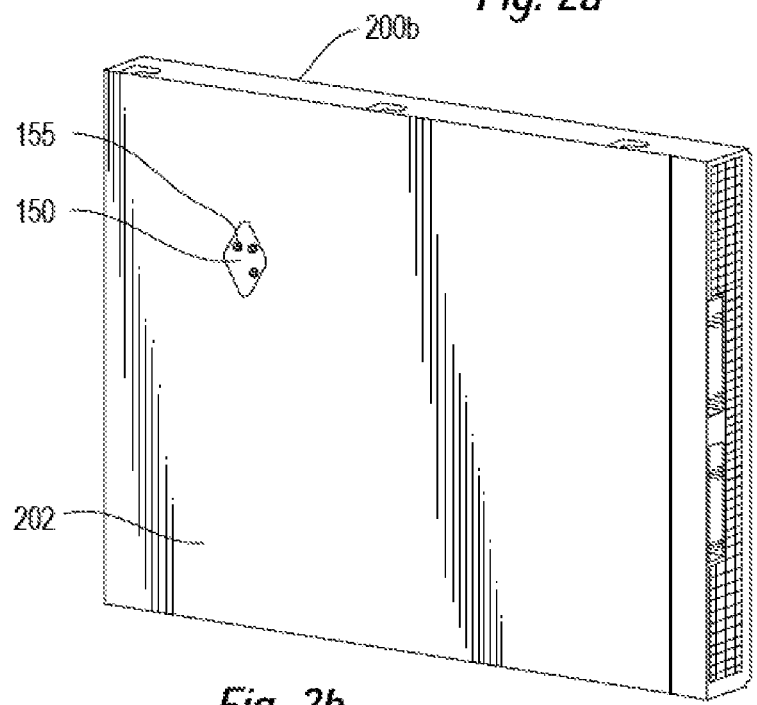
FIG. 2b is second module according to an example embodiment of the invention.

FIGS. 2a and 2b are a first module and a second module according to an example embodiment of the invention. The first module 200a includes a first housing 101 with an aperture 130. The aperture 130 is large enough for a first port 105 to pass through the aperture 130 in the first housing 101.

The second module 200b includes a second port 160 on the second housing 202. A first port 105 includes a first alignment device 110 and the second port 150 includes a second alignment device 155. The first alignment device 110 and the second alignment device 155 can align the first port 105 and the second port 150 when the first module 200a and a second module 200b are adjacent. The first alignment device 110 or the second alignment device 155 may not align the first port 105 with a second port 150 until the first port 105 is extended through the first housing 101. The first port 105 can be extended through the first housing 101 if the plunger 125 is forced into the first housing 101.

In one embodiment, the second module 200b can include an base, a mount, first device, arm, and plunger to extend the second port 150 through the second housing 202 or retract the second port 150 into the second housing 202 depending on whether the plunger is being forced into the second housing 202. In another embodiment the second port 150 may be attached to the second housing 202 and may not retract into the second housing 202 or extends from the second housing 202.

Figure 3:
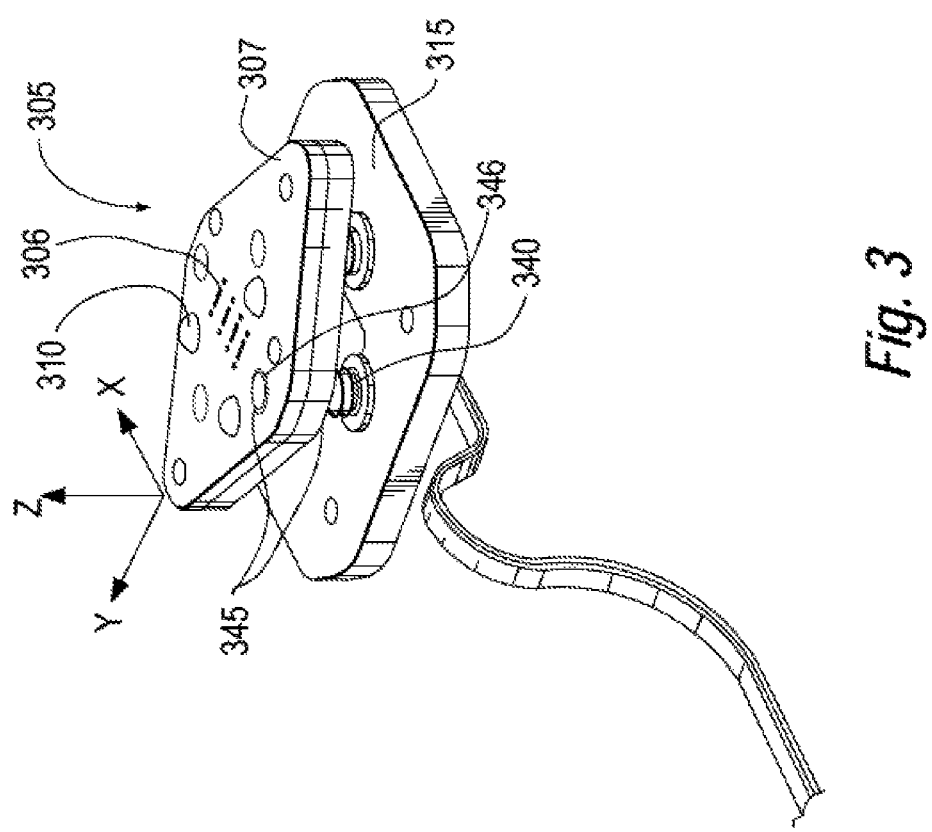
FIG. 3 is a port according to an example embodiment of the invention.

FIG. 3 is a port according to an example embodiment. The first port 305 can include a head 307. The head 307 can include a data bus 306. The data bus 306 may include channels for both transmitting data and receiving data. For example if the data bus 306 is an optical data bus an optical signal generating device such as infrared light emitting diode may be the transmission channel and an infrared photo detector may be the receiving channel.

The head 307 can be attached to a base 315. To attach the had 307 to the base 315 can be a guide 345. In one embodiment the guide 345 secures the head 307 of the first port 305 to the base 315 while allowing that had 307 to move in the Z. direction. Allowing be head 307 to move in the Z. direction can prevent damage to the first port if the first port is being connected to a second port. For example if the base were to extend the first port through an opening in a module a variation in the thickness of the had 307 the base 315 or another component may cause the first port to either not connect to the second port or may apply a force on the second port causing damage to either the first port or the second port.

A spring 340 can be between the had of 307 and the base 315 the spring can apply a force to a head 307. If the had 307 of the first port comes in contact with the head of the second port the spring 340 will compress allowing the first port to connect to the second port without causing damage to the first port 305 or the second port. The force applied by the spring 342 the head 307 can be less than a force that could damage the first port 305 or the second port.

A first port may connect to a second port that is not aligned in either the X direction or the Y direction with the first port 305. The guide 345 can allow the head 307 to move in the X direction or the Y direction or both the X direction and the Y direction independently of the base 316. For example the head 307 may have an opening 346 that contains the guide 345. The opening 346 may be larger than the guide 345, for example the opening 346 in the head 307 may be circular with a diameter of 5 mm and the guide may also be circular with a diameter of 3 mm. If the center of the guide 345 is in the center of the opening the head 307 can move 1 mm in the X direction, that the Y direction for both the text and the Y direction. This can allow a variation in the alignment of the first port 305 with a second port equal to the difference between the opening and the guide 345. The opening 346 may alternatively be in the base 315 and allow the guide 345 to move in the X and Y direction in the opening in the base 315 to allow the head 307 to move in the X and Y direction. If the opening 346 is in the base 315 and contains the guide 345 the connection between the head 307 and the guide 345 may not allow for X and Y movement of the guide relative to the head. If the opening 346 is in the had 307 and contains the guide 345 then connection between the base 315 and the guide 346 may not allow for X and Y movement of the guide relative to the base.

If for example the head 307 is attached by two guides 346 the head 307 may move in the X direction at one guide 345 and may move it in the negative X direction at another guide 345 causing the head 307 to rotate about the Z axis. In one embodiment the alignment devices 310 can align the first port 305 to a second port in the X and Y direction and also rotate the head 307 of the first port 305 to match the rotation about the Z axis of a second port.

Figure 4:
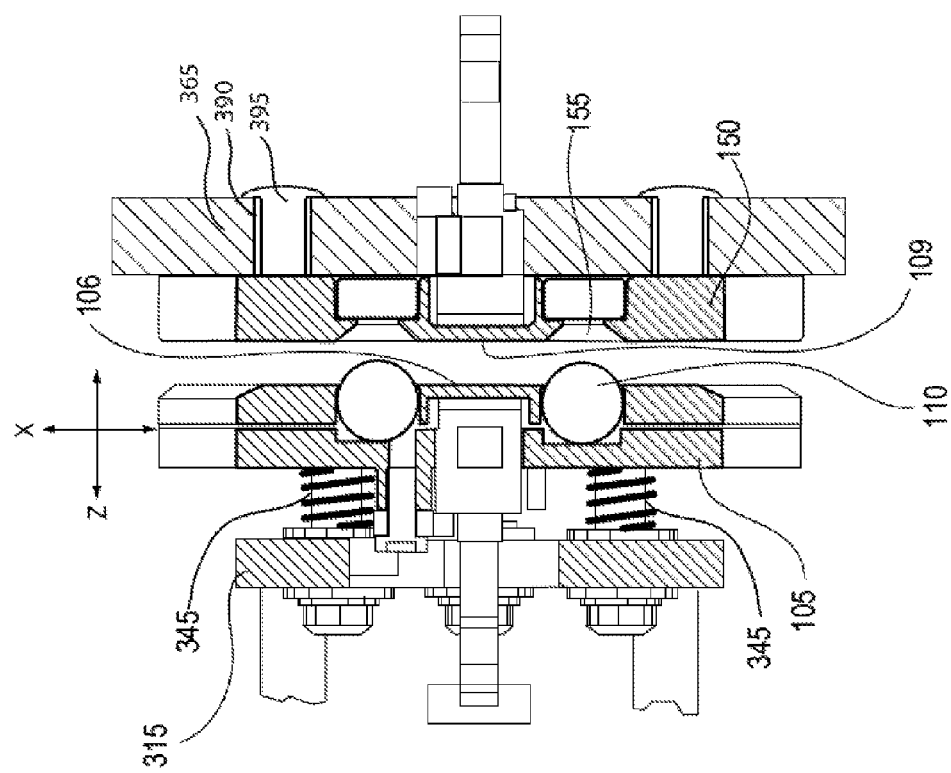
FIG. 4 is a cross-sectional view of a first port and second port according to an example embodiment of the invention.

FIG. 4 is a cross-sectional view of a first port 106 and a second port 150. The first port 105 includes first alignment devices 110. The first alignment devices 110 can include for example a convex shape on the outer surface of the first port 105. The second port 150 can include second alignment devices 155. The second on the materials 155 can be and for example a concave shape.

The first alignment device 110 can cause the first port 106 to move in the X. direction to align the first bus 106 with the second bus 109 when approaching the second alignment devices 155. For example if the first port 105 was 1 mm in the X. direction from being aligned with a second port 150 be first alignment device will cause the first port 106 to move 1 mm in the extraction so that the first bus 106 and the second bus 109 properly align. If the first port 106 were to remain 1 mm in the extraction from the location of the second port the first bus 106 may not be able to communicate with the second bus 109 and the data cannot be transferred. The movement of 1 mm in the X. direction may be relative to the base 315 that is connected to the first port by guides 345.

Although the first alignment device 110 in the second alignment device 165 are depicted in the figure as a specific shape the first alignment device 110 and the second alignment device 165 can be of any shapes that may fit together and help to align the first port 105 with the second port 109. For example the first alignment device 110 may be a cone or a pyramid.

In one embodiment the first port 105 includes multiple first alignment devices 110. The Multiple first alignment devices 110 can be inserted into multiple second alignment devices 155. The multiple first alignment devices 110 entity multiple second alignment devices 155 may reduce the rotation of the first port 105 or the second port 150 about the Z. axis. If a first port or a second port were rotated about the Z. axis the first bust 106 and the second bus 109 may not aligned properly and data cannot be communicated between the first port 105 and the second port 150.

The second port 150 may be attached to a second base 365. The second base 365 may have openings 390 through the second base 365. The second port may be attached to the second base with a fastener 395. The fastener 395 can be for example a rivet, screw, or some other fastener. The opening 390 in the second base 365 can be larger than the fastener to allow the fastener to move in the X direction and the Y direction. Movement of the fastener in the X or direction can allow the second port 150 to move in the X or Y direction.

Figure 5:
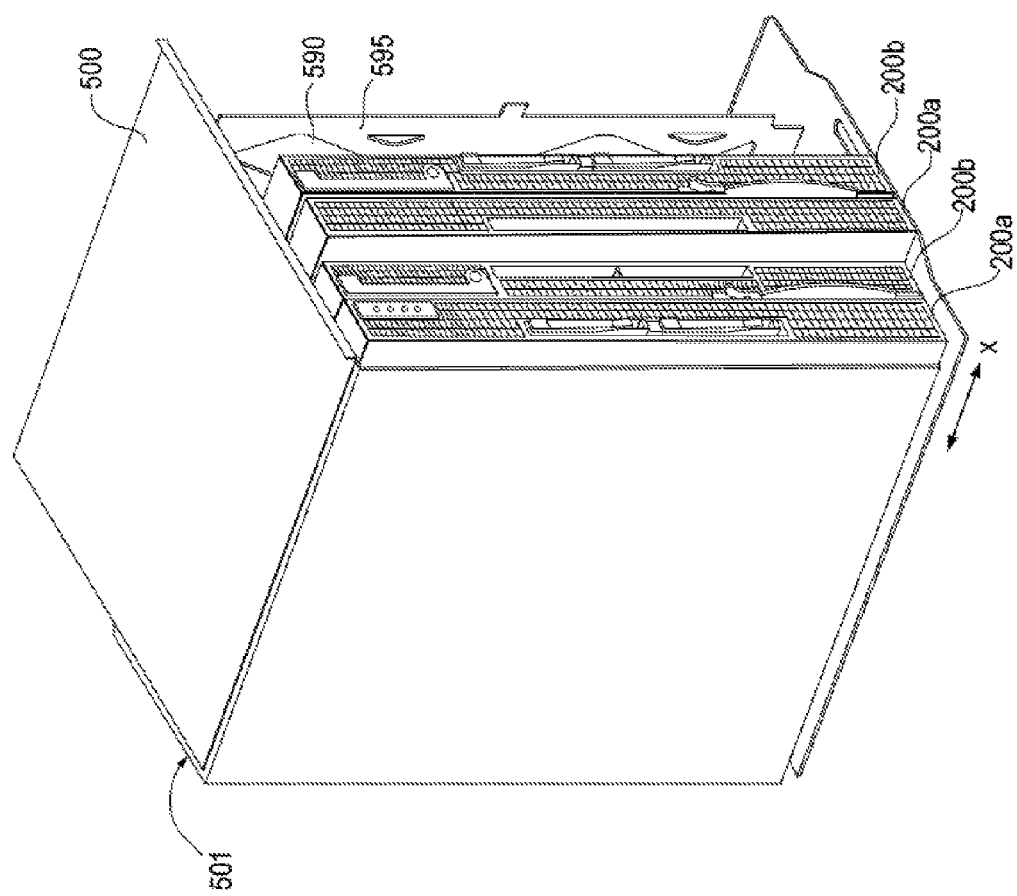
FIG. 5 is a system according to an example embodiment of a chassis of the invention.

FIG. 5 is a system according to an example embodiment of a chassis of the invention. The chassis 500 includes dividers 595. The dividers 595 can include openings 590. The dividers 595 can create a volume for a module to be inserted into. For example the first modules 200a and the second modules 200b are inserted into the chassis 500. The first module 200a is adjacent to the second module 200b. If the first module 200a is adjacent to the second module 200b the first port on the first module 200a can align with the second port on the second module 200b to create a data bus between the first module 200a and a second module 200b. The connection between the first port and a second port allows the first module 200a to communicate data with the second module 200b without using a data bus that is part of the chassis 500. The chassis 500 may have a data bus that can be used by the first module 200a to communicate with a second module 200b. The chassis 500 may also include other components such as a power supply or a power distribution system to supply power to the first module 200a and the second module 200b.

In one embodiment the openings 590 in the divider 595 are the same or similar shape as the first port on the first module 200a. This allows the first port to extend from the first module 2000. and to pass through the divider and connect to the second port on the second module 200b. The first port is extended from the first module 200a if the plunger of the first module 200a comes in contact with the chassis 500. If the plunger comes in contact with the chassis 500 and is forced into the first module 200a it can move the arm and the first device causing the base to extend the first port from the first module 200a. The plunger will not be forced into the first module 200a until the first module 200a is almost completely inserted into the chassis 500 so that the first port is not extended from the first module 200a until the first module is almost completely inserted into the chassis 500.

If a module 200a is removed from the chassis 500 in the X. direction the plunger of the first module 200a will not be contacting the chassis 500 causing the first port to retract through the divider and into the first module 200a preventing damage to the first port by the divider 595.

Figure 6:
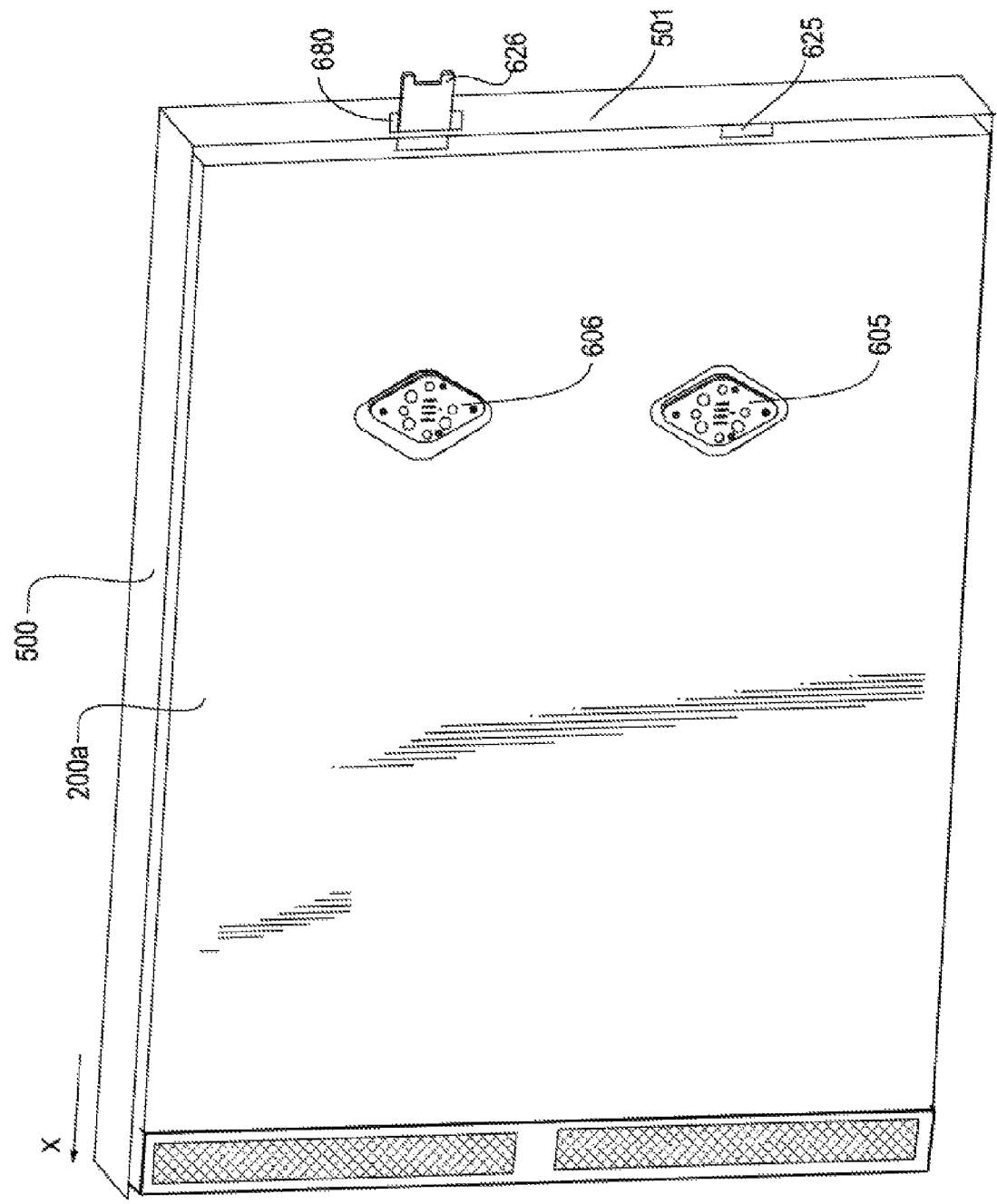
FIG. 6 cross-sectional view of the chassis according to an example embodiment of the invention.

FIG. 6 cross-sectional view of the chassis 500 according to an example embodiment of the invention. In one embodiment the chassis 500 may have an opening in the back 501 of the chassis 500 that the plunger 626 of the first module 200a may fit through or fit into so that the plunger is not forced into the first module 200a. The opening 680 in the back 501 can be in a chassis that does not support a first port of a first module 200a being able to communicate directly with a second port of a second module 200b. For example a chassis may support a port in a first location of the first module 200a but not in a second location of the first module. If the first port 605 is in the first location then the back 501 of the chassis 500 may cause the plunger 625 for the first port to be forced into the first module 200a. If the first port 606 is at a second location then the back 501 of the chassis 500 may have an opening 680 that prevents the plunger 626 from being forced into the first module 200a so that the first port 606 does not extend from the first module 200a.

Figure 7:
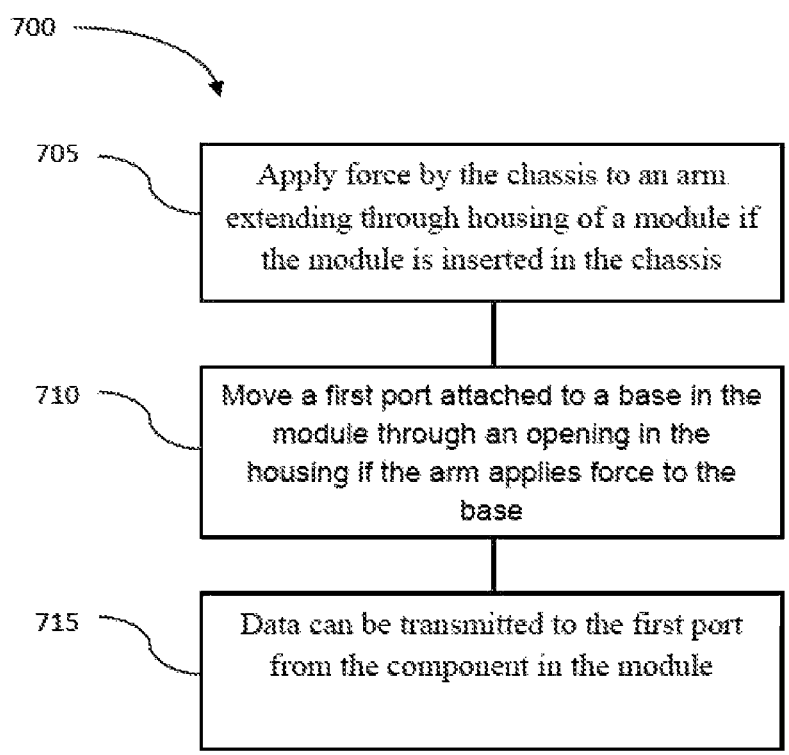
FIG. 7 is a flow chart of a method of creating a data bus according to an example embodiment of the invention.

FIG. 7 is a flow chart of a method of creating a data bus according to an example embodiment of the invention. The method 700 begins by applying force to an arm extending through the housing of a computing system at 705. A first port attached to a base can be moved in the module through an opening in the housing if the arm applies force to the base at 710. The moveable base is attached either directly or indirectly to a housing of the computing system. If the movable base has had a force applied to it from the movement of the arm then the data may be transmitted to the first port from a component in the module at 715.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom.

It is intended that the appended claims cover such modifications and variations as fall within the true spirit and scope of the invention.

What is claimed is:

1. A computing system comprising:
   a module including a first housing with an opening;
   a first port attached to a base wherein the base is inside the first housing and the first port extends through the opening if force is applied to the base;
   a first device to exert force on the base and to extend the first port through the opening if an arm connected to the device is forced toward the base by a chassis.

2. The system of claim 1, wherein the first device is a ramp.

3. The system of claim 1, further comprising a resilient system between the first port and the device.

4. The system of claim 3, wherein the resilient system is a spring.

5. The system of claim 1, further comprising a second opening in the housing for the arm to pass through.

6. The system of claim 1, further comprising a magnetic material to attract the first port to a second port.

7. The system of claim 1, further comprising the chassis to exert force on the arm if the module is installed in the chassis.

8. The system of claim 1, further comprising a second module installed in the chassis.

9. The system of claim 8, wherein the second module includes a second port to connect to the first port.

10. A method of connecting modules of a computing system, comprising:
    applying force by a chassis to an armor extending from a housing of a module if the module is inserted in the chassis;
    moving a first port attached to a base in the module through an opening in the housing if the arm applies force to the base; and
    transmitting data to the first port from a component in the module.

11. The method of claim 10, further comprising receiving the data from a first port in the first port with a second port that is connected to the first port.

12. The method of claim 10, further comprising moving the first port in an X or Y direction relative to the base.

13. A computing system comprising:
    a chassis;
    a first module with a port that is extended through an opening in the housing f the module if the first module is installed in the chassis;
    a second module with a second put to contact the first port if the first and second computer are inserted in the chassis.

14. The system of claim 13, further comprising an arm extending through the housing of the first module to contact the chassis if the first module is installed in the chassis.

15. The system of claim 14, further comprising a base to receive a force if the arm contact the chassis and wherein the base moves the first port into contact with the second port.

* * * * *

UNITED STATES PATENT AND TRADEMARK OFFICE
CERTIFICATE OF CORRECTION

PATENT NO. : 8,848,360 B2  
APPLICATION NO. : 13/702202  
DATED : September 30, 2014  
INVENTOR(S) : Arlen L. Roesner et al.

Page 1 of 1

It is certified that error appears in the above-identified patent and that said Letters Patent is hereby corrected as shown below:

On the title page, item (75), Inventors, in column 1, line 2, delete "Kessier" and insert -- Kessler --, therefor.

In the Claims

In column 6, line 31, in Claim 10, delete "armor" and insert -- arm --, therefor.

In column 6, line 47, in Claim 13, delete "f" and insert -- of --, therefor.

In column 6, line 49, in Claim 13, delete "put" and insert -- port --, therefor.

In column 6, line 50, in Claim 13, delete "computer" and insert -- computers --, therefor.

Signed and Sealed this  
Fourth Day of August, 2015

Michelle K. Lee  
*Director of the United States Patent and Trademark Office*